(12) United States Patent
Li et al.

(10) Patent No.: US 12,376,325 B2
(45) Date of Patent: Jul. 29, 2025

(54) SEMICONDUCTOR STRUCTURE WITH A TRANSITION LAYER LOCATED BETWEEN GATE AND ION IMPLANTATION LAYER AND METHOD FOR MANUFACTURING SAME

(71) Applicant: CHANGXIN MEMORY TECHNOLOGIES, INC., Hefei (CN)

(72) Inventors: Xiong Li, Hefei (CN); Bin Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 359 days.

(21) Appl. No.: 17/807,904

(22) Filed: Jun. 21, 2022

(65) Prior Publication Data
US 2023/0074214 A1    Mar. 9, 2023

Related U.S. Application Data

(63) Continuation of application No. PCT/CN2021/131899, filed on Nov. 19, 2021.

(30) Foreign Application Priority Data

Sep. 6, 2021 (CN) .......................... 202111038367.9

(51) Int. Cl.
*H10D 30/60* (2025.01)
*H10B 12/00* (2023.01)
(Continued)

(52) U.S. Cl.
CPC .......... *H10D 30/601* (2025.01); *H10B 12/34* (2023.02); *H10D 30/022* (2025.01);
(Continued)

(58) Field of Classification Search
CPC .......... H01L 21/26506; H01L 29/7833; H01L 29/66492; H01L 29/66659; H01L 29/7835;
(Continued)

(56) References Cited

U.S. PATENT DOCUMENTS 7,994,005 B2 *  8/2011  Hebert ................ H10D 30/668
                                             257/341
2008/0296670 A1  12/2008  Lee
(Continued)

FOREIGN PATENT DOCUMENTS

CN      101930926 B    6/2012
CN      105489607 A    4/2016
(Continued)

OTHER PUBLICATIONS

US non-final OA1 in U.S. Appl. No. 17/814,517, mailed on May 22, 2025.

*Primary Examiner* — Sonya McCall-Shepard
(74) *Attorney, Agent, or Firm* — Syncoda LLC; Feng Ma (57) ABSTRACT

A semiconductor structure includes a semiconductor substrate, a trench being provided in the semiconductor substrate, and a gate being formed in the trench; an ion implantation layer located in the semiconductor substrate outside the trench, a top surface of the ion implantation layer being higher than that of the gate, and a bottom surface of the ion implantation layer being lower than the top surface of the gate and higher than a bottom surface of the gate; a transition layer located between the gate and the ion implantation layer, a bottom surface of the transition layer being lower than the top surface of the gate and higher than the bottom surface of the gate, and a doping concentration of the transition layer being lower than that of the ion implantation layer.

17 Claims, 9 Drawing Sheets

(51) Int. Cl.
- *H10D 30/01* (2025.01)
- *H10D 30/87* (2025.01)
- *H10D 62/13* (2025.01)
- *H10D 62/17* (2025.01)
- *H10D 64/01* (2025.01)
- *H10D 64/27* (2025.01)
- *H10D 84/00* (2025.01)

(52) U.S. Cl.
CPC ......... *H10D 62/151* (2025.01); *H10D 64/027* (2025.01); *H10D 64/513* (2025.01)

(58) Field of Classification Search
CPC ........... H01L 29/4236; H01L 29/66621; H01L 29/7834; H10B 12/34; H10B 12/053; H10D 30/601; H10D 30/022; H10D 62/151; H10D 64/027; H10D 64/513
See application file for complete search history.

(56) References Cited

U.S. PATENT DOCUMENTS

| | | | |
|---|---|---|---|
| 2016/0104782 A1 | 4/2016 | Lee et al. | |
| 2021/0050426 A1 | 2/2021 | Li | |
| 2022/0052055 A1 | 2/2022 | Chun | |

FOREIGN PATENT DOCUMENTS

| | | | | |
|---|---|---|---|---|
| CN | 103247681 B | | 9/2016 | |
| CN | 107978629 A | | 5/2018 | |
| CN | 108511518 A | | 9/2018 | |
| CN | 108735608 A | * | 11/2018 | ....... H01L 21/26506 |
| CN | 108987282 A | | 12/2018 | |
| CN | 110875391 A | | 3/2020 | |
| CN | 111063722 A | | 4/2020 | |
| CN | 112086454 A | | 12/2020 | |
| CN | 112331651 A | | 2/2021 | |

* cited by examiner

SEMICONDUCTOR STRUCTURE WITH A TRANSITION LAYER LOCATED BETWEEN GATE AND ION IMPLANTATION LAYER AND METHOD FOR MANUFACTURING SAME

CROSS-REFERENCE TO RELATED APPLICATIONS

This application is a continuation application of International Application No. PCT/CN2021/131899 filed on Nov. 19, 2021, which claims priority to Chinese Patent Application No. 202111038367.9 filed on Sep. 6, 2021. The disclosures of these applications are hereby incorporated by reference in their entirety.

BACKGROUND

With the rapid development of very large scale integration circuit (VLSI) technology, the size of semiconductor devices is decreasing. Due to the sharp reduction of semiconductor devices, the thickness of a transistor gate oxide layer is reduced to 2 nm or even thinner. While the size of the semiconductor devices is scaled down, the operating voltage does not decrease proportionally, which leads to the strong gate-induced-drain-leakage (GIDL) current effect of short channel devices, thereby affecting the reliability of the semiconductor devices. Therefore, how to reduce the GIDL current effect in semiconductor devices has become an urgent problem to be solved.

SUMMARY

The embodiment of the present disclosure relates to the technical field of semiconductor, and relates to but is not limited to, a semiconductor structure and a method for manufacturing the same.

In view of this, the embodiments of the disclosure provide a semiconductor structure and a method for preparing the semiconductor structure.

In a first aspect, the embodiments of the disclosure provide a semiconductor structure, and the semiconductor structure comprises a semiconductor substrate, an ion implantation layer and a transition layer.

A trench is provided in the semiconductor substrate, and a gate is formed in the trench. The ion implantation layer is located in the semiconductor substrate outside the trench, in which in a direction perpendicular to the semiconductor substrate, a top surface of the ion implantation layers is higher than a top surface of the gate, and a bottom surface of the ion implantation layer is lower than the top surface of the gate and higher than a bottom surface of the gate. The transition layer is located between the gate and the ion implantation layer, in which in the direction perpendicular to the semiconductor substrate, a bottom surface of the transition layer is lower than the top surface of the gate and higher than the bottom surface of the gate, and a doping concentration of the transition layers is lower than a doping concentration of the ion implantation layer.

In a second aspect, the embodiments of the disclosure provide a method for preparing a semiconductor structure, the method comprises: performing a first ion implantation on a semiconductor substrate to form an ion implantation layer; etching the semiconductor substrate provided with the ion implantation layer to form a trench in the semiconductor substrate, at least part of the trench being formed in the ion implantation layer, and forming a transition layer on at least part of a sidewall of the trench; in which, a material of the transition layer is a doped semiconductor material, and a doping concentration of the transition layer is less than a doping concentration of the ion implantation layer; forming a gate in the trench.

DETAILED DESCRIPTION

In order to facilitate to understand the present disclosure, a more complete description will be provided below with reference to the relative accompanying drawings. Preferred embodiments of the present disclosure are provided in the accompanying drawings. However the present disclosure may be implemented in many different forms and is not limited to the embodiments described herein. Rather these embodiments are provided so that the disclosure of the present disclosure will be more thoroughly and comprehensively understood.

Unless otherwise defined, all technical and scientific terms used herein have the same meanings as being commonly understood by those skilled in the art of the present disclosure. Terms used herein in the specification of the present disclosure are for the purpose of describing specific embodiments only and are not intended to limit the present disclosure. The term "and/or" used herein includes any combination and all combinations of one or more related listed items.

Figure 1:
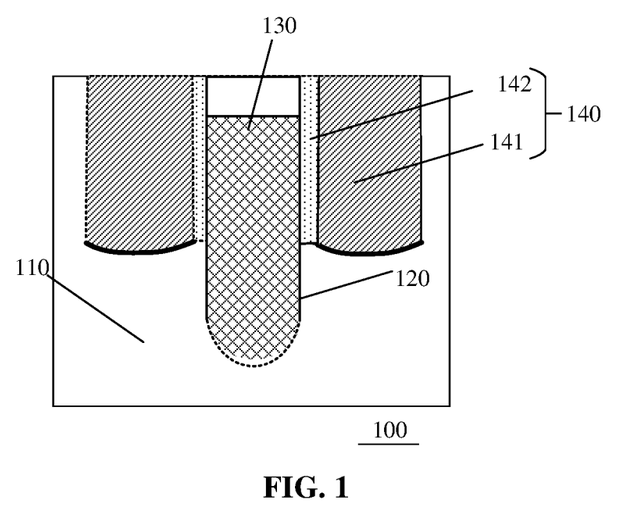
FIG. 1 illustrates a schematic diagram 1 of a semiconductor structure provided by an embodiment of the present disclosure.

The embodiments of the disclosure provide a semiconductor structure, as shown in FIG. 1, the semiconductor structure 100 includes: a semiconductor substrate 100, an ion implantation layer 141, and a transition layer 142. A trench 120 is provided in the semiconductor substrate 100, and a gate 130 is formed in the trench 120. The ion implantation layer 141 is located in the semiconductor substrate outside the trench 120, in a direction perpendicular to the semiconductor substrate 110, a top surface of the ion implantation layers 141 is higher than a top surface of the gate 130, and a bottom surface of the ion implantation layers 141 is lower than the top surface of the gate 130 and higher than a bottom surface of the gate 130; The transition layer 142 is located between the gate 130 and the ion implantation layer 141, in the direction perpendicular to the semiconductor substrate 110, a bottom surface of the transition layers 142 is lower than the top surface of the gate 130 and higher than the bottom surface of the gate 130, and a doping concentration of the transition layers 142 is lower than a doping concentration of the ion implantation layers 141.

The semiconductor substrate 10 may be a P-type semiconductor material substrate such as a silicon (Si) substrate or a germanium (Ge) substrate, etc., an N-type semiconductor substrate such as a indium phosphide (InP) substrate, a compound semiconductor material substrate such as a silicon germanium (SiGe) substrate, etc., a silicon on insulator (SOI) substrate, or a germanium on insulator (GeOI) substrate, etc. In an embodiment, the semiconductor substrate is a P-type semiconductor substrate, i.e. N-type ions are first implanted into a substrate, and a deep N-well is formed by high-temperature dejunction, and then P-type ions are implanted into the top of the deep N-well to form the P-well.

An array of transistors can be arranged on the semiconductor substrate, which is used to realize the functions of data storage, reading and writing. The gates of the transistors are located in the trenches formed in the semiconductor substrate. In the array of transistors, the gates of the same row may be connected for forming a word line of the entire semiconductor device. In this way, the word line is buried in the semiconductor substrate, so it can be called a buried word line (BWL). The source and the drain of the transistor are composed of the ion implantation layers formed in the semiconductor substrate. The ion implantation layers on both sides of a gate may be the source and the drain respectively, that is, there are discrete ion implantation layers on both sides of the trench.

Ion implantation layers are formed by doping in the semiconductor substrate. The impurities may be divided into two types: N type and P type. N-type impurity mainly includes phosphorus (P), arsenic (As) and antimony (Sb), etc. P-type impurity mainly includes boron (B) and indium (In), etc.

The transition layer is located between the gate and the ion implantation layer, and the material and the doped ions of the transition layer may be the same as those of the ion implantation layer, and the difference is that, the doping ion concentration of the transition layer is smaller than that of the ion implantation layer. That is, the ion implantation layer is a heavily doped region and the transition layer is a lightly doped region. In this way, a source-drain area with graded junction can be formed, and the local electric field between the source-drain area and the gate can be reduced, thereby reducing the GIDL between the gate and the source-drain area.

In some embodiments, in the direction perpendicular to the semiconductor substrate, the bottom surface of the transition layer is not lower than the bottom surface of the ion implantation layer.

The bottom surface of the transition layer is not lower than the bottom surface of the ion implantation layer, that is, the projection of the ion implantation layer in the direction perpendicular to the substrate is completely covered by the projection of the transition layer in the direction perpendicular to the substrate, so that the ion implantation layer will not be directly connected to the gate. If the ion implantation layer is directly connected to the gate, there is no graded junction in this area, and the GIDL effect may still occur. When the depth of the sidewall of the trench covered by the transition layer is greater than or equal to the depth of the ion implantation layer, the effect of reducing the local electric field is better.

Figure 2:
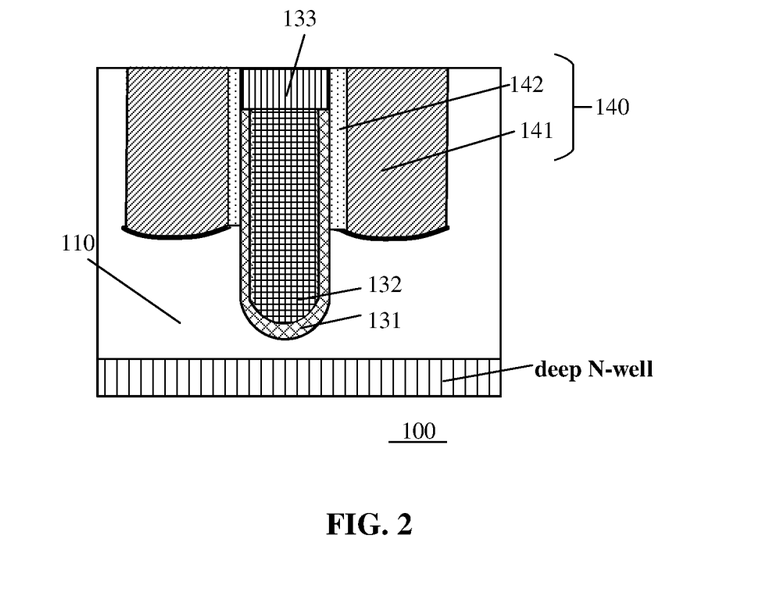
FIG. 2 illustrates a schematic diagram 2 of a semiconductor structure provided by an embodiment of the present disclosure.

In some embodiments, as shown in FIG. 2, the gate 130 comprises a gate oxide layer 131 and a gate conductive layer 132.

The gate oxide layer 131 covers an inner wall surface of the trench 120.

The gate conductive layer 132 located in the trench 120 covered by the gate oxide layer 131.

The gate oxide layer is used for isolating the conductive layer and a doping layer, and is a thin film covering the inner wall surface of the trench. The material of the gate oxide layer may be silicon dioxide or the like.

The gate conductive layer is located in the trench covered by the gate oxide layer. The gate conductive layer may be formed of a metal material, such as tungsten, nickel, tungsten-nickel alloy, or the like.

The gate oxide layer may be formed by a growth process, such as in-situ steam generation (ISSG) in a selective growth manner. The in-situ steam generation is a thermal annealing deposition method, which forms a high-quality oxide thin film by heating in a cavity and introducing oxygen atoms to combine with silicon atoms of the semiconductor substrate. A deposition process such chemical vapor deposition (CVD) may also be used to form an oxide thin film serving as the gate oxide layer.

A deposition process may be used for filling the gate conductive layer. In some embodiments, the deposition process may include CVD, physical vapor deposition (PVD), plasma enhanced CVD (PECVD), sputtering, metal organic chemical vapor deposition (MOCVD), atomic layer deposition (ALD), or the like.

In some embodiments, as shown in FIG. 2, an insulating layer 133 is further provided in the trench 120.

The insulating layer 133 covers the gate 130.

The insulating layer covers the gate so that the gate conductive layer is buried in the semiconductor substrate. The material of the insulating layer may be oxide, and may also be silicon nitride or other materials.

In one embodiment, the insulating layer may cover the gate conductive layer, and the gate oxide layer covers the inner wall of the whole trench. The method for forming the insulating layer may also adopt a growth process, a deposition process or the like.

Figure 3:
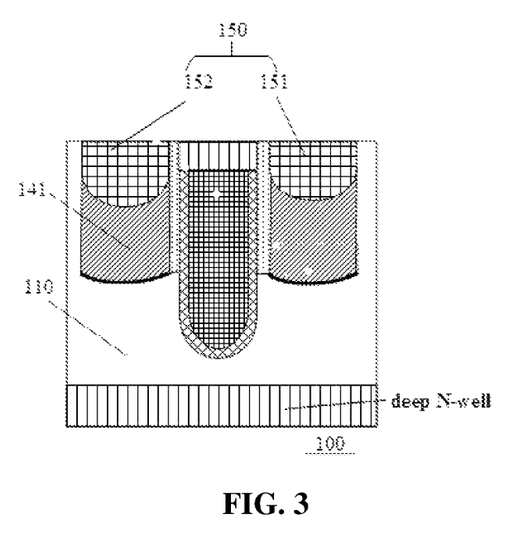
FIG. 3 illustrates a schematic diagram 3 of a semiconductor structure provided by an embodiment of the present disclosure.

In some embodiments, as shown in FIG. 3, the semiconductor structure further comprises a contact structure 150 formed on the ion implantation layer 141.

In the embodiments of the present disclosure, the contact structure is formed on the ion implantation layer, and the contact structure is made of a conductive material, such as a semiconductor material or a metal material. In an embodiment, the material of the contact structure may be polysilicon. The contact structure is used for being in contact with signal lines such as bit lines, ground lines and the like in the semiconductor device.

In some embodiments, as shown in FIG. 3, the contact structure 150 includes a bit line contact structure 151 and a storage node contact structure 152, in which the bit line contact structure 151 and the storage node contact structure 152 are discretely formed on the ion implantation layer 141.

The bit line contact structure is used for being in contact with the bit line, i.e. the bit line is connected to the above-mentioned bit line contact structure of each semiconductor structure, so that the bit line signal can be transmitted to the source in a semiconductor structure through the bit line contact structure.

The storage node contact structure is connected with the memory cell, such as a capacitor. When the transistors of the semiconductor structure are in conduction state, the signal transmitted through the bit line contact structure can be transmitted to the storage node contact structure through the conductive channel formed by the semiconductor substrate under the action of an electric field, and then be transmitted to the memory cell to realize charge storage.

Figure 4:
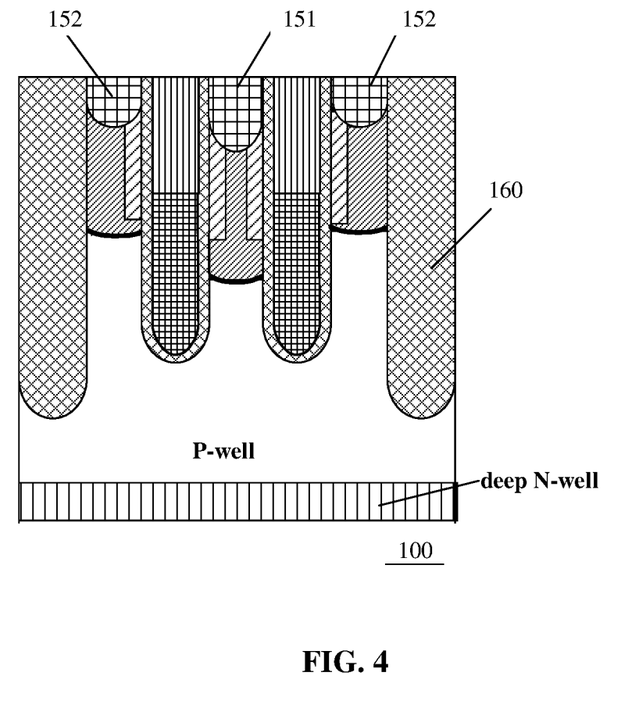
FIG. 4 illustrates a schematic diagram 4 of a semiconductor structure provided by an embodiment of the present disclosure.

In some embodiments, as shown in FIG. 4, the semiconductor structure 100 further comprises isolation layers 160 located in the semiconductor substrate outside the ion implantation layers 141, and the depth of the isolation layers 160 is greater than or equal to the depth of the trench 120.

Here, a pair of transistors may be provided between each adjacent two isolation layers, and may have a common source or a common drain. That is, an isolation layer is provided between every two pairs of transistors. Electrical isolation between one pair of transistors and another pair of transistors can be realized by such isolation layers.

The isolation layers may be formed as follows. A silicon nitride layer is deposited on the semiconductor substrate, and then the silicon nitride layer is patterned to form a hard mask. Next, the base is etched to form steep trenches between adjacent transistor elements. Finally, oxide is filled in the trenches to form the isolation layers. In the embodiment of the present disclosure, the depth of the isolation layers is greater than or equal to the depth of the trenches, so that the effect of electrical isolation is better.

Figure 5:
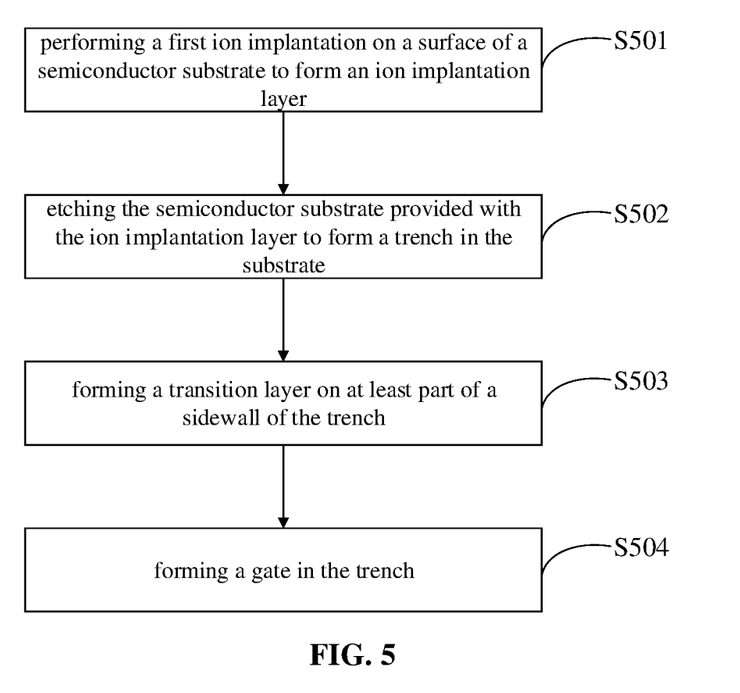
FIG. 5 illustrates a flow chart of a method for preparing a semiconductor structure provided by an embodiment of the present disclosure.

The embodiments of the disclosure also provide a method for manufacturing a semiconductor structure, as shown in FIG. 5, the method includes: S501: performing a first ion implantation on a semiconductor substrate to form an ion implantation layer; S502: etching the semiconductor substrate provided with the ion implantation layer to form a trench, at least part of the trench being formed in the ion implantation layer; S503: forming a transition layer on at least part of a sidewall of the trench; in which, a material of the transition layer is a doped semiconductor material, and a doping concentration of the transition layer is less than a doping concentration of the ion implantation layer; S504: forming a gate in the trench.

Figure 6:
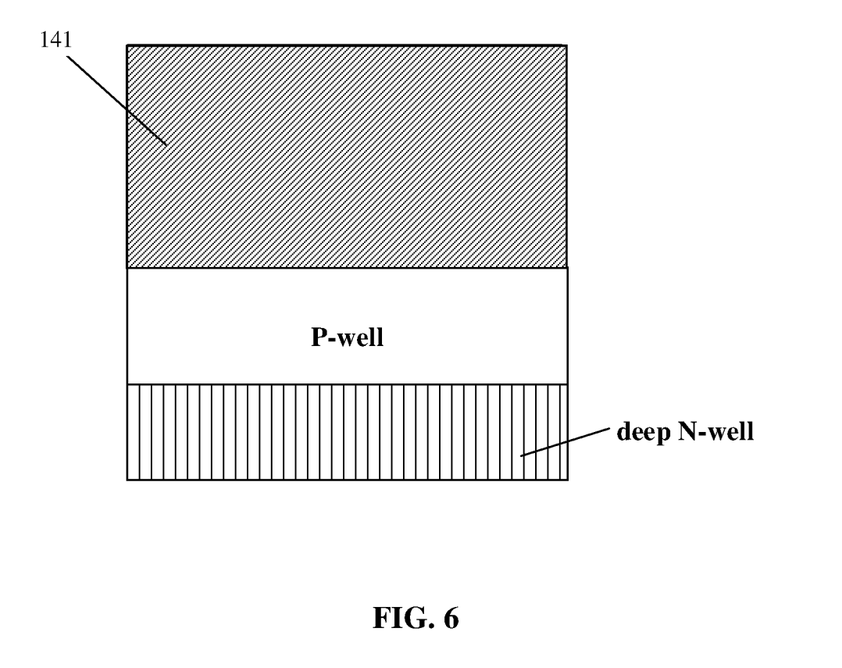
FIG. 6 illustrates a schematic diagram of forming an ion implantation layer in a method for preparing a semiconductor structure provided by an embodiment of the present disclosure.

As shown in FIG. 6, in S501 the semiconductor substrate may be doped by ion implantation on the surface of the semiconductor substrate to form the ion implantation layer 141; the semiconductor substrate includes a surface and a back surface opposite to the surface. Here, the surface of the semiconductor substrate refers to the side far away from the deep N-well or the deep P-well. The surface and the partial area below the surface of the semiconductor substrate may be used for forming various elements. The process parameters of ion implantation include impurity type, implantation energy and doping dose. The impurities may be divided into two types: N type and P type. N-type impurity mainly includes phosphorus, arsenic and antimony, etc., and P-type impurity mainly includes boron and indium, etc. For example, implantation ions selected for embodiments of the present disclosure may be As+/P+. The implantation energy value of the first ion implantation may be 40 KeV, and the doping dose value of the first ion implantation may be $6 \times 10^{12}$ atom/cm2. When impurity atoms are implanted into the surface of the semiconductor substrate by an ion implanter, the ion implantation layer can be formed in the surface of the semiconductor substrate.

Figure 7:
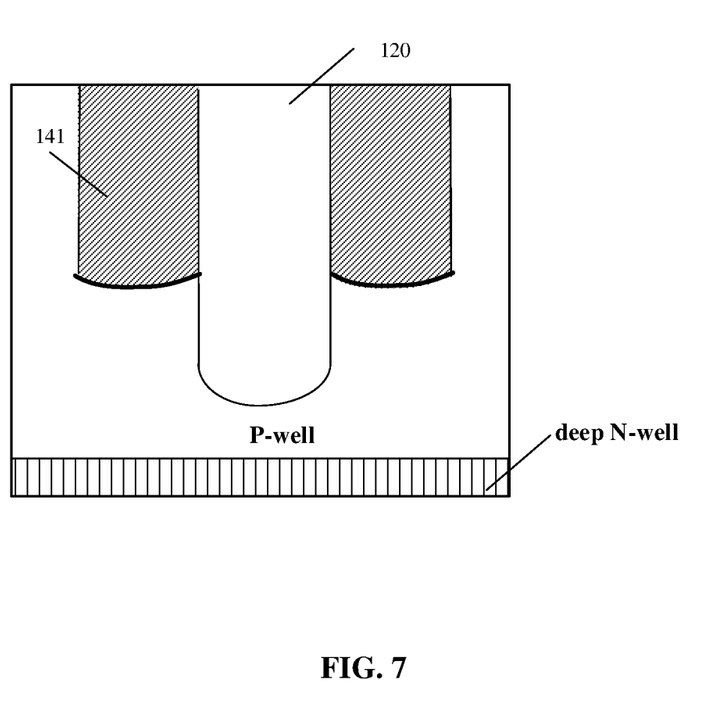
FIG. 7 illustrates a schematic diagram of forming a trench in a method for preparing a semiconductor structure provided by an embodiment of the present disclosure.

As shown in FIG. 7, in S502 a trench 120 may be formed in the semiconductor substrate by etching which includes dry etching, wet etching or the like. At least part of the trench 120 is formed in the ion implantation layer 141. In addition, part of the bottom of the trench 120 may extend into the semiconductor substrate 110 under the ion implantation layer 141.

After the trench is formed, a transition layer may be formed on the inner wall of the trench, and the transition layer may be formed by ion implantation. The material and the doped ions of the transition layer may be the same as or different from those of the ion implantation layer, and the difference is that, the doping ion concentration of the transition layers is smaller than that of the ion implantation layer. In the embodiments of the present disclosure, the implantation ions for the transition layer may be As+/P+, and the implantation energy value may be 20 KeV, and the doping dose value may be $4 \times 10^{13}$ atom/cm$^2$.

In some embodiments, the process of etching the semiconductor substrate provided with the ion implantation layer to form a trench, at least part of the trench being formed in the ion implantation layer, and forming a transition layer on at least part of the sidewall of the trench comprise: etching the ion implantation layer to form a first trench; forming a transition layer on a sidewall of the first trench; etching the semiconductor substrate downward along the part of the first trench not covered by the transition layer to form a second trench in the semiconductor.

The ion implantation layer is dry etched or wet etched, and the etching depth is less than or equal to the depth of the ion implantation layer, so that the first trench is formed. After the first trench is formed, the transition layer is formed on the sidewall and the bottom of the first trench, and then the transition layer at the bottom of the first trench is removed. Then the ion implantation layer is continuously etched downward into the semiconductor substrate on the part of the first trench, that is not covered by the transition layer (i.e. the bottom of the first trench), thereby forming the second trench in the semiconductor substrate.

In this way, the transition layer covering at least part of the sidewall of the ion implantation layer is formed, so that the region between the ion implantation layer and the gate conductive layer is covered as much as possible by the transition layer, thereby reducing the possibility of electric leakage between the two. Referring to FIG. 2, the region between the ion implantation layer and the gate conductive layer is the region from the bottom of the ion implantation layer 141 to the top of the gate conductive layer 132 and from the side wall of the ion implantation layer 141 to the side wall of the gate conductive layer 132.

In some embodiments, the process of etching the semiconductor substrate provided with the ion implantation layer to form the trench in the semiconductor substrate, at least part of the trench being formed in the ion implantation layer, and forming the transition layer on at least part of the sidewall of the trench comprise: etching the ion implantation layer and part of the semiconductor substrate to form a first trench; forming the transition layer on the sidewall of the first trench; etching the semiconductor substrate downward along the part of the first trench not covered by the transition layer to form a second trench.

The ion implantation layer is dry etched or wet etched, and the etching depth is greater than the depth of the ion implantation layer, and part of the semiconductor substrate is etched, so that the first trench is formed. After the first trench is formed, the transition layer is formed on the sidewall and the bottom of the first trench, and then the transition layer at the bottom of the first trench is removed, and then the ion implantation layer is continuously etched downward into the semiconductor substrate on the part of the first trench that is not covered by the transition layer (i.e. the bottom of the first trench), thereby forming the second trench in the semiconductor substrate.

In this way, the formed transition layer can cover the entire region between the ion implantation layer and the gate conductive layer, thereby further reducing the possibility of electric leakage.

In some embodiments, the process of etching the semiconductor substrate provided with the ion implantation layer to form the trench in the semiconductor substrate, at least part of the trench being formed in the ion implantation layer, and forming the transition layer on at least part of the sidewall of the trench comprise: forming a dielectric layer on the ion implantation layer; patterning the dielectric layer, and etching the semiconductor substrate with the ion implantation layer by using the dielectric layer as a mask to form the trench.

Before the above-mentioned trench is formed, the dielectric layer may be formed to cover the surface of the ion implantation layer, and the dielectric layer serves as the mask to shield the region where it doesn't need to form the trench.

In the embodiments of the present disclosure, the dielectric layer above mentioned may be a photoresist material, and the dielectric layer is patterned by means of ultraviolet light irradiation or the like, so that the part shielded will not be etched off.

Next, the ion implantation layer and the semiconductor substrate are etched by using the dielectric layer as the mask to form the trench.

It should be noted that the process of etching to form a trench, forming the transition layer, forming the gate and the like may be implemented under the condition of mask shielding, and finally the mask is removed to form the final semiconductor structure.

In some embodiments, a process of forming the transition layer on the sidewall of the trench comprises: forming a layer to be doped on the sidewall of the trench; and performing tilted ion implantation on the layer to be doped to form the transition layer.

The layer to be doped may be first formed on at least part of the sidewall of the trench, and the means for forming the layer to be doped includes a growth process or a deposition process. The growth process includes, but is not limited to, an oxidation process or a nitriding process. The deposition process includes, but is not limited to, dry/wet diffusion, biochemical sedimentation (BIO), in situ steam generation (ISSG), etc.

The material of the layer to be doped may be the same as that of the semiconductor substrate. In the embodiment of the present disclosure, the material of the semiconductor substrate may be a P-type silicon substrate, so the material of the layer to be doped may be monocrystalline silicon or polysilicon.

In an embodiment, a layer to be doped may be first formed on the sidewall of the first trench, the bottom of the trench and the surface of the dielectric layer, and the layer to be doped at the bottom of the trench and the surface of the dielectric layer is then removed by means including but not limited to wet etching or dry etching. As the layer to be doped has a high aspect ratio, the layer to be doped is subjected to tilted ion implantation to form a transition layer, and after the transition layer is formed, downward etching is performed to form a second trench.

In another embodiment, after the first groove is formed, downward etching is further performed to form a second trench, and then a layer to be doped is formed on the sidewall of the second trench, on the bottom of the trench and the surface of the dielectric layer. Next the layer to be doped on the bottom of the trench and the surface of the dielectric layer is removed by means including but not limited to wet etching or dry etching, leaving only the layer to be doped on the sidewall of the trench. As the layer to be doped has a high aspect ratio, tilted ion implantation is performed on the layer to be doped to form the transition layer.

Herein the process parameters of ion implantation include impurity type, implantation energy and doping dose. The impurities can be divided into two types: N type and P type. N-type impurity mainly includes phosphorus, arsenic and antimony, and the like. P-type impurity mainly includes boron and indium, and the like. When impurity atoms are implanted into the layer to be doped on the sidewall of the first trench, a transition layer may be formed. It should be noted that, the doping concentration of the transition layer is required to be less than the doping concentration of the ion implantation layer. Therefore, the implantation energy for the layer to be doped is less than the implantation energy for the ion implantation layer, and the implantation dose for the layer to be doped is greater than the implantation dose for the ion implanted layer.

In some embodiments, a process of forming the gate in the trench comprises: forming a gate oxide layer on an inner wall of the trench; and forming a gate conductive layer in the trench whose inner wall is covered by the gate oxide layer.

The gate oxide layer may be formed by a growth process, in which oxygen atoms are introduced to combine with silicon atoms in the semiconductor substrate to form a high-quality oxide film. A deposition process may also be used to deposit an oxide thin film serving as the gate oxide layer.

The gate conductive layer may be formed by deposition process, in which a metal material is deposited in the trench, and the gate conductive layer and the gate oxide layer together form a buried gate. In an embodiment, the trench may penetrate through a plurality of transistors, and the deposited gate conductive layer may be connected to form a metal line serving as a word line of these transistors, i.e. the buried word line.

In some embodiments, the method further comprises: etching back the gate conductive layer, in which a top surface of the etched gate conductive layer is not lower than a bottom surface of the transition layer; and filling an insulating material in the trench to form an insulating layer; in which the insulating layer covers the gate.

In an embodiment, the back etching may be performed only on the gate conductive layer within the trench, such that the thickness of the gate conductive layer is reduced. The surface of the gate conductive layer after back etching is lower than the surface of the substrate, and a trench is formed on the gate conductive layer.

Next, an insulating material may be filled in the trench to allow the surface of the insulating material to be flush with the surface of the substrate, thereby forming an insulating layer; the method for filling includes a deposition process, such as CVD or plasma enhanced atomic layer deposition. The insulating material may be a nitride layer, an oxide layer or a laminated film composed of both the nitride layer and the oxide layer. As an example, in the embodiments of the present disclosure, silicon nitride may be selected as the insulating material. The insulating layer is used for insulating the gate and the source/drain, and for burying the gate in the substrate.

In some embodiments, the method further comprises: forming a contact structure on a surface of the ion implantation layer; in which the contact structure comprises a bit line contact structure and a storage node contact structure, the bit line contact structure and the storage node contact structure are discretely formed on the two sides of the trench.

In the embodiments of the present disclosure, as shown in FIG. 3, during forming the contact structure, the separated ion implanted layers are etched back. The etching method includes but is not limited to dry etching and wet etching. After etching, a first recess region and a second recess region are formed on the ion implantation layer. A conductive material such as a conductive metal nitride or polysilicon or the like is deposited in the first recess region and the second recess region, so as to further form a bit line contact structure and a storage node contact structure.

In another embodiment, as shown in FIG. 4, the discrete ion implantation layers and the transition layers together may also be etched back, and a first recess region and a second recess region may be formed on the ion implantation layers and the transition layers. A conductive material such as a conductive metal nitride or polysilicon or the like is deposited in the first recess region and the second recess region, so as to further form a bit line contact structure and a storage node contact structure.

In yet another embodiment, a layer of conductive material may be directly deposited on the surface of the ion implantation layer to form the bit line contact structure and the storage node contact structure above mentioned.

In some embodiments, the method further comprises: forming an isolation layer located in the semiconductor substrate outside the ion implantation layer, a depth of the isolation layer being not lower than a depth of the trench.

In an embodiment, a plurality of isolation layers may also be formed in the semiconductor substrate. The isolation layer may be composed of an insulating material extending from the surface of the substrate to the inside of the substrate and is used for isolating the semiconductor device. The process for forming the isolation layer may include the following operations. A silicon nitride layer is deposited on the semiconductor substrate, and then the silicon nitride layer is patterned to form a hard mask. Next, the base is etched to form a channel between adjacent elements. Finally, oxide is filled in the channel to form an element isolation layer.

In the embodiments of the present disclosure, a pair of transistors may be provided between each adjacent two isolation layers, and the pair of transistors may have a common source or a common drain. Electrical isolation between one pair of transistors and another pair of transistors can be realized by such isolation layer. Moreover, the depth of the isolation layer is greater than or equal to the depth of the trenches, so that the effect of electrical isolation is better.

Embodiments of the present disclosure provide the following examples.

Figure 8:
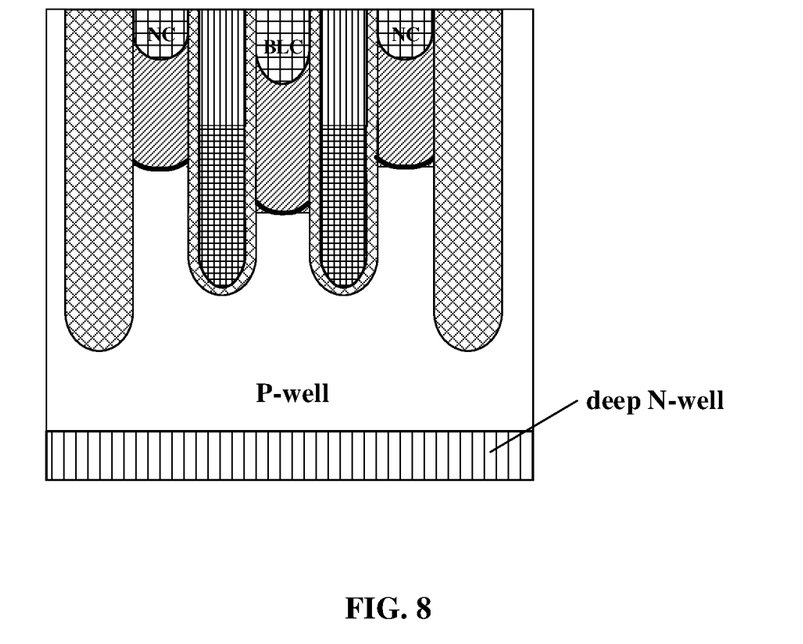
FIG. 8 illustrates a schematic diagram of a semiconductor structure.

A traditional semiconductor device structure is shown in FIG. 8. Node contact (NC) and Bit Line contact (BLC) form S/D by one-step ion implantation, while the doping concentration in the region between NC end and BWL is too high, which leads to the local electric field being too high, thereby leading to the increase of GIDL and the decrease of data storage time.

Figure 9:
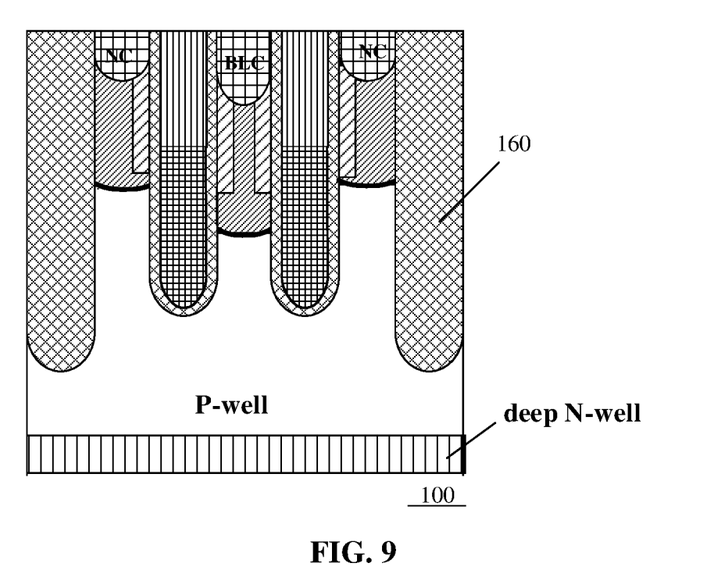
FIG. 9 illustrates a schematic diagram 5 of a semiconductor structure provided by an embodiment of the present disclosure.

The embodiments of the present disclosure provide a semiconductor device structure, as shown in FIG. 9. The semiconductor device structure has a lightly doped transition layer and a heavily doped ion implantation layer, and the lightly doped transition layer is located between a gate and the heavily doped ion implantation layer. The heavily doped ion implantation layer adopts high energy and low dose of ion implantation, for example, 40 KeV, $6\times10^{12}$ atom/cm' of As+/P+ ion implantation, and the lightly doped transition layer adopts low energy and high dose of ion implantation, for example, 20 KeV, $4\times10^{13}$ atom/cm$^2$ of As+/P+ ion implantation, so that the region between the heavily doped region and the gate is reduced. Referring to FIG. 2, the region between the heavily doped region and the gate is the region from the bottom of the ion implantation layer 141 to the top of the gate conductive layer 132 and from the side wall of the ion implantation layer 141 to the side wall of the gate conductive layer 132. Lightly doping is used in the region to form a graded junction, thus reducing the local electric field and decreasing GIDL, and finally alleviating the problem that the data storage time of the semiconductor device is reduced.

The embodiments of the disclosure further provide a method for preparing the above mentioned semiconductor structure, and the method includes the following operations.

S1: a first ion implantation is performed in the semiconductor substrate to form a heavily doped ion implantation layer, and on the basis, etching is preformed to form the trench Herein, trenches with different depths may be formed simultaneously or successively. Here, the trench with a shallower depth is used to form a gate, and the trench with a deeper depth, that is, a third trench, is used to form the isolation layer. Therefore, the depth of the third trench may be greater than that of the trench for the gate.

Then, a layer to be doped is formed on the sidewall of the trench for the gate, and a second ion implantation is performed to form a lightly doped transition layer.

S2: a gate is formed in the trench, in which the gate includes a gate oxide layer, a gate conductive layer and an insulating layer. The gate conductive layer may extend along the trench and run through a plurality of transistors, thereby forming a buried word line.

S3: a contact structure is formed on the surface of the ion implantation layer, the contact structure includes a bit line contact structure and a storage node contact structure.

It could be understood that the solution for forming a semiconductor structures provided by the embodiments of the present disclosure have at least the following advantages relative to some implementations:

The S/D of a semiconductor device is changed from the original ion implantation region to the addition of the transition layer with lower doping concentration, so as to form a graded junction in the region of S/D and BWL.

For the depth of high energy and low dose of ion implantation, the W/SiN interface is taken as the target depth, which reduces the region between the heavily doped region and BWL, reduces the local electric field, and thus reduces the GIDL.

The different design goal of semiconductor devices can be satisfied by adjusting the combination of energy and dose of the first and second implantation.

This semiconductor structure is suitable for advanced DRAM products, and can improve the problem that the data storage time of DRAM products is reduced.

It should be understood that references to "one embodiment" or "an embodiment" throughout the specification mean that specific features, structures, or characteristics related to the embodiments are included in at least one embodiment of the present disclosure. Thus, the terms "in one embodiment" or "in an embodiment" appearing throughout the specification do not necessarily refer to the same embodiment. Further these specific features, structures or characteristics may be incorporated in any suitable manner in one or more embodiments. It should be understood that, in various embodiments of the present disclosure, the size of the sequence number of the above-described processes does not mean the sequence of execution, and the execution order of each process should be determined by its function and inherent logic, and should not limit the implementation of the embodiments of the present disclosure. The above serial numbers of the embodiments of the present disclosure are for description only and do not represent the advantages and disadvantages of the embodiments.

It should be noted that, the terms used herein "including", "comprising" or any other variation thereof are intended to encompass non-exclusive inclusion, so that a process, a method, an article or a device that includes a set of elements includes not only those elements but also other elements that are not explicitly listed, or also elements inherent to such the process, method, article or device. In the absence of further limitations, an element defined by the phrase "includes a/an . . . " does not exclude the existence of another identical element in the process, method, article or device in which the elements is included.

The descriptions above are only some embodiments of the present disclosure, and are not intended to limit the scope of protection of the embodiments of the present disclosure. Changes or replacements which those skilled in the art can easily think of fall with the protection scope of the present disclosure. Therefore, the scope of protection of the embodiments of the present disclosure shall be subject to the scope of protection of the claims.

In the embodiments of the present disclosure, the gate is formed in the trench, the transition layer is arranged on the sidewall of the trench, the ion implantation layer is arranged at the position adjacent to the trench, and the source and the drain are formed on the ion implantation layers. The transition layer and the ion implantation layer are formed by two different doping, so that the doping concentration of the transition layer is less than that of the ion implantation layer, and the local electric field is reduced, thereby alleviating the GIDL problem.

What is claimed is:
1. A semiconductor structure, comprising:
    a semiconductor substrate; wherein a trench is provided in the semiconductor substrate, and a gate is formed in the trench;
    an ion implantation layer, located in the semiconductor substrate outside the trench, wherein in a direction perpendicular to the semiconductor substrate, a top surface of the ion implantation layer is higher than a top surface of the gate, and a bottom surface of the ion implantation layer is lower than the top surface of the gate and higher than a bottom surface of the gate; and
    a transition layer, located between the gate and the ion implantation layer, wherein in the direction perpendicular to the semiconductor substrate, a bottom surface of the transition layer is lower than the top surface of the gate and higher than the bottom surface of the gate, and a doping concentration of the transition layer is lower than a doping concentration of the ion implantation layer;
    wherein doped ion of the transition layer is same as doped ion of the ion implantation layer; and
    wherein the semiconductor structure further comprises a contact structure formed on the ion implantation layer.

2. The semiconductor structure according to claim 1, wherein in the direction perpendicular to the semiconductor substrate, the bottom surface of the transition layer is not lower than the bottom surface of the ion implantation layer.

3. The semiconductor structure according to claim 1, wherein the gate comprises:
    a gate oxide layer and a gate conductive layer,
    wherein, the gate oxide layer covers an inner wall surface of the trench; and
    the gate conductive layer is located in the trench covered by the gate oxide layer.

4. The semiconductor structure according to claim 3, further comprising an insulating layer in the trench,
    wherein the insulating layer covers the gate.

5. The semiconductor structure according to claim 1, wherein the contact structure comprises a bit line contact structure and a storage node contact structure, wherein the bit line contact structure and the storage node contact structure are discretely formed on the ion implantation layer.

6. The semiconductor structure according to claim 1, further comprising an isolation layer located in the semiconductor substrate outside the ion implantation layer, wherein a depth of the isolation layer is greater than or equal to a depth of the trench.

7. A method for manufacturing a semiconductor structure, comprising:
    performing a first ion implantation on a semiconductor substrate to form an ion implantation layer;
    etching the semiconductor substrate provided with the ion implantation layer to form a trench in the semiconductor substrate, at least part of the trench being formed in the ion implantation layer, and forming a transition layer on at least part of a sidewall of the trench,
    wherein a material of the transition layer is a doped semiconductor material, and a doping concentration of the transition layer is less than a doping concentration of the ion implantation layer, doped ion of the transition layer is same as doped ion of the ion implantation layer;
    forming a gate in the trench; and
    forming a contact structure on a surface of the ion implantation layer.

8. The method according to claim 7, wherein etching the semiconductor substrate provided with the ion implantation layer to form the trench in the semiconductor substrate, at least part of the trench being formed in the ion implantation layer, and forming the transition layer on at least part of the sidewall of the trench, comprises:
    etching the ion implantation layer to form a first trench;
    forming the transition layer on an sidewall of the first trench; and
    etching the semiconductor substrate downward along part of the first trench not covered by the transition layer to form a second trench.

9. The method according to claim 7, wherein etching the semiconductor substrate provided with the ion implantation layer to form the trench in the semiconductor substrate, at least part of the trench being formed in the ion implantation layer, and forming the transition layer on at least part of the sidewall of the trench, comprises:
    etching the ion implantation layer and part of the semiconductor substrate to form a first trench;
    forming the transition layer on the sidewall of the first trench; and etching the semiconductor substrate downward along part of the first trench not covered by the transition layer to form a second trench.

10. The method according to claim 7, wherein etching the semiconductor substrate provided with the ion implantation layer to form the trench in the semiconductor substrate, at least part of the trench being formed in the ion implantation layer, and forming the transition layer on at least part of the sidewall of the trench, comprises:
forming a dielectric layer on the ion implantation layer; and
patterning the dielectric layer, and etching the semiconductor substrate provided with the ion implantation layer by using the dielectric layer as a mask to form the trench.

11. The method according to claim 8, wherein forming the transition layer on the sidewall of the first trench comprises:
forming a layer to be doped on the sidewall of the first trench; and
performing tilted ion implantation on the layer to be doped to form the transition layer.

12. The method according to claim 9, wherein forming the transition layer on the sidewall of the first trench comprises:
forming a layer to be doped on the sidewall of the first trench; and
performing tilted ion implantation on the layer to be doped to form the transition layer.

13. The method according to claim 10, wherein forming the transition layer on the sidewall of the first trench comprises:
forming a layer to be doped on the sidewall of the first trench; and
performing tilted ion implantation on the layer to be doped to form the transition layer.

14. The method according to claim 7, wherein forming the gate in the trench comprises:
forming a gate oxide layer on an inner wall of the trench; and
forming a gate conductive layer in the trench whose inner wall is covered by the gate oxide layer.

15. The method of claim 14, wherein the method further comprises:
etching back the gate conductive layer, wherein a top surface of the etched gate conductive layer is not lower than a bottom surface of the transition layer; and
filling the trench with an insulating material to form an insulating layer, wherein the insulating layer covers the gate.

16. The method of claim 7, wherein
the contact structure comprises a bit line contact structure and a storage node contact structure, the bit line contact structure and the storage node contact structure are discretely formed on two sides of the trench.

17. The method of claim 8, further comprising:
forming an isolation layer located in the semiconductor substrate outside the ion implantation layer, wherein a depth of the isolation layer is not lower than a depth of the trench.

* * * * *